United States Patent [19]
Miki et al.

[11] Patent Number: 6,137,363
[45] Date of Patent: Oct. 24, 2000

[54] OPERATIONAL AMPLIFIER

[75] Inventors: Takeshi Miki; Junji Hayakawa, both of Okazaki, Japan

[73] Assignee: Denso Corporation, Kariya, Japan

[21] Appl. No.: 09/141,031

[22] Filed: Aug. 27, 1998

[30]   Foreign Application Priority Data

Aug. 27, 1997  [JP]  Japan .................................. 9-231101

[51] Int. Cl.[7] .................................................. H03F 3/45
[52] U.S. Cl. ........................... 330/255; 330/257; 330/300
[58] Field of Search .................................... 330/252, 253, 330/255, 257, 300

[56]            References Cited

U.S. PATENT DOCUMENTS

| | | | |
|---|---|---|---|
| 3,879,640 | 4/1975 | Schade, Jr. .................................. 317/31 |
| 4,241,313 | 12/1980 | Takehara .............................. 330/255 X |
| 4,695,750 | 9/1987 | Hara et al. ........................... 330/300 X |
| 5,077,489 | 12/1991 | Gola et al. ........................... 330/257 X |
| 5,101,126 | 3/1992 | Butler et al. ......................... 330/300 X |
| 5,343,164 | 8/1994 | Holmdahl ............................. 330/255 X |

FOREIGN PATENT DOCUMENTS 50-115984  9/1975  Japan .

*Primary Examiner*—Steven J. Mottola
*Attorney, Agent, or Firm*—Pillsbury Madison & Sutro LLP

[57]          ABSTRACT

An operational amplifier comprises a differential amplifying circuit and an output circuit. The differential amplifying circuit comprises a pair of input transistors having control terminals connected to an inverting input terminal and a non-inverting input terminal, respectively. The output circuit is connected to the differential amplifying circuit for amplifying an output signal of the differential amplifying circuit and generating an amplified output from its output terminal. In this operational amplifier, the input transistors are bipolar transistors and other transistors are MOS transistors.

14 Claims, 4 Drawing Sheets

OPERATIONAL AMPLIFIER

BACKGROUND OF THE INVENTION

The present invention relates to an operational amplifier preferably used for controlling various apparatus.

Among conventional operational amplifiers, a CMOS (Complementary Metal Oxide Semiconductor) operational amplifier is generally known as constituting all of required transistors by P-channel MOS transistors and/or N-channel MOS transistors.

In general, the CMOS operational amplifier has an excellent operational speed (i.e., high through rate) due to the inherent characteristics of MOS transistors that can operate quickly with low power consumption.

However, using only MOS transistors for the transistors required in the operational amplifier, especially in its differential amplifying circuit, raises the following problem.

The withstanding voltage of MOS transistors is generally in a level of 10~20 V that is relatively lower compared with that of other transistors. If an excessive large voltage (e.g., a positive surge voltage) is applied to either an inverting input terminal or a non-inverting input terminal, an input MOS transistor connected to the inverting input terminal or the non-inverting input terminal will be damaged or the performance of this input MOS transistor will be deteriorated. In other words, it is impossible for the MOS transistors to provide a sufficiently high withstanding voltage for each input signal.

To solve this problem, namely to protect the MOS transistor from an excessively high voltage, it may be possible to interpose a diode or a Zener diode between gate and source terminals of the input MOS transistor as disclosed in Published Japanese patent application No. Kokai 50-115984. However, this increases the total number of circuit elements in the operational amplifier. Not only the cost will increase, but the manufacturing process will be complicated.

SUMMARY OF THE INVENTION

In view of the problem encountered in the prior art, an object of the present invention is to provide an operational amplifier capable of attaining a quick response (i.e., high through rate) and providing a high withstanding voltage without adding special protector elements.

In order to accomplish this and other related objects, an aspect of the present invention provides an operational amplifier comprising an inverting input terminal, a non-inverting input terminal and an output terminal. A differential amplifying circuit of this operational amplifier comprises a pair of input transistors having control terminals connected to the inverting input terminal and the non-inverting input terminal, respectively. An output circuit is connected to the differential amplifying circuit for amplifying an output signal of the differential amplifying circuit and generating an amplified output from its output terminal. The input transistors are bipolar transistors having base terminals serving as the control terminals connected to the inverting input terminal and the non-inverting input terminal, respectively. Other transistors provided in the operational amplifier are MOS transistors.

According to a preferable embodiment of the present invention, the differential amplifying circuit comprises first and second MOS transistors cooperatively constituting a current mirror circuit. The first MOS transistor produces a first terminal potential responsive to a voltage applied to the inverting input terminal, and the second MOS transistor produces a second terminal potential responsive to a voltage applied to the non-inverting input terminal. The output circuit generates the output responsive to a difference between the first terminal potential and the second terminal potential.

The first and second MOS transistors may be N-channel MOS transistors that are associated with P-channel MOS transistors having gate terminals connected to output terminals of the input transistors.

Alternatively, the first and second MOS transistors may be N-channel MOS transistors that are associated with current mirror circuits connected to output terminals of the input transistors.

According to a preferable embodiment of the present invention, at least one of the first and second MOS transistors is serially connected with a trimming resistor that is adjustable to optimize an operational balance of the differential amplifying circuit.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
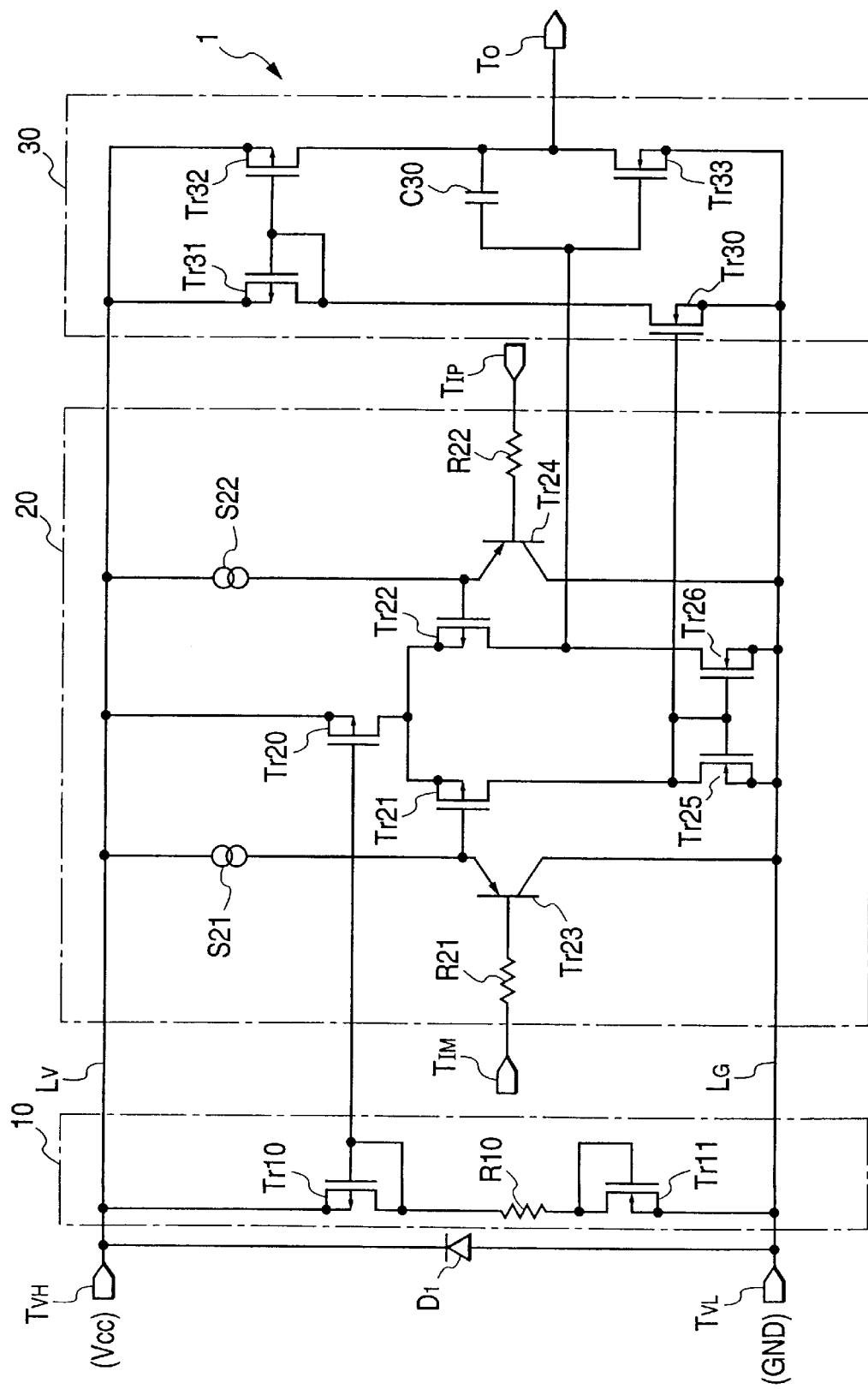
FIG. 1 is a circuit diagram showing an operational amplifier in accordance with a first embodiment of the present invention.

Preferred embodiments of the present invention will be explained hereinafter with reference to attached drawings. Identical parts are denoted by the same reference numerals throughout the views.

First Embodiment

FIG. 1 is a circuit diagram showing an arrangement of an operational amplifier 1 in accordance with a first embodiment of the present invention.

As shown in FIG. 1, the operational amplifier 1 comprises a high-voltage terminal $T_{VH}$ connected to a power-voltage terminal (Vcc=5V) of a DC power source and a low-voltage terminal $T_{VL}$ connected to a ground terminal (GND=0V) of the DC power source. Furthermore, the operational amplifier 1 comprises an inverting input terminal $T_{IM}$, a non-inverting input terminal $T_{IP}$, and an output terminal $T_O$. The high-voltage terminal $T_{VH}$ is connected to a power line $L_V$ of the operational amplifier 1. The low-voltage terminal $T_{VL}$ is connected to a ground line $L_G$ of the operational amplifier 1.

The operational amplifier 1 comprises a differential amplifying circuit 20 serving as an input stage. A secondary stage of the operational amplifier 1 is an output circuit 30 that amplifies an output signal of the differential amplifying circuit 20 and generates an amplified output from an output terminal $T_O$. Furthermore, the operational amplifier 1 comprises a constant current circuit 10 that supplies constant drive current to the differential amplifying circuit 20.

The differential amplifying circuit 20 comprises a current-supplying P-channel MOS (Metal Oxide Semiconductor) transistor Tr20 that has a source terminal connected to the power line $L_V$. A gate terminal of the current-supplying P-channel MOS transistor Tr20 is connected to a gate terminal of a current-adjusting P-channel MOS transistor Tr10 that operates to produce the constant current in the constant current circuit 10. The current-supplying P-channel MOS transistor Tr20 has a drain terminal generating the same current as the constant current flowing in the constant current circuit 10. First and second P-channel MOS transistors Tr21 and Tr22 have source terminals commonly connected to the drain terminal of the current-supplying P-channel MOS transistor Tr20.

A first PNP transistor Tr23, serving as one input transistor, has an emitter terminal connected to the gate terminal of the first P-channel MOS transistor Tr21, a collector terminal connected to the ground line $L_G$, and a base terminal connected to the inverting input terminal $T_{IM}$ via a resistor R21. A second PNP transistor Tr24, serving as another input transistor, has an emitter terminal connected to the gate terminal of the second P-channel MOS transistor Tr22, a collector terminal connected to the ground line $L_G$, and a base terminal connected to the non-inverting input terminal $T_{IP}$ via a resistor R22.

A first constant-current source S21, supplying constant current to the first PNP transistor Tr23, has one end connected to the power line $L_V$ and the other end connected to both the emitter terminal of the first PNP transistor Tr23 and the gate terminal of the first P-channel MOS transistor Tr21. A second constant-current source S22, supplying constant current to the second PNP transistor Tr24, has one end connected to the power line $L_V$ and the other end connected to both the emitter terminal of the second PNP transistor Tr24 and the gate terminal of the second P-channel MOS transistor Tr22.

A first N-channel MOS transistor Tr25 has a drain terminal connected to the drain terminal of the first P-channel MOS transistor Tr21, a gate terminal connected to its drain terminal, and a source terminal connected to the ground line $L_G$. A second N-channel MOS transistor Tr26 has a drain terminal connected to the drain terminal of the second P-channel MOS transistor Tr22 and a source terminal connected to the ground line $L_G$. A gate terminal of the second N-channel MOS transistor Tr26 is commonly connected with the gate terminal of the first N-channel MOS transistor Tr25. Thus, the first N-channel MOS transistor Tr25 and the second N-channel MOS transistor Tr26 cooperatively constitute a current mirror circuit.

The output circuit 30 comprises a third N-channel MOS transistor Tr30 having a gate terminal connected to the drain and gate terminals of the first N-channel MOS transistor Tr25 and a source terminal connected to the ground line $L_G$. The drain terminal of the third N-channel MOS transistor Tr30 is connected to a drain terminal of a third P-channel MOS transistor Tr 31. The third P-channel MOS transistor Tr31 comprises a gate terminal connected to its drain terminal and a source terminal connected to the power line $L_V$.

Furthermore, the output circuit 30 comprises a fourth P-channel MOS transistor Tr32 having a source terminal connected to the power line $L_V$ and a gate terminal connected to the gate terminal of the third P-channel MOS transistor Tr31. Thus, the third P-channel MOS transistor Tr31 and the fourth P-channel MOS transistor Tr32 cooperatively constitute a current mirror circuit. A fourth N-channel MOS transistor Tr33 comprises a gate terminal connected to the drain terminal of the second N-channel MOS transistor Tr26, a source terminal connected to the ground line $L_G$, and a drain terminal connected to the drain terminal of the fourth P-channel MOS transistor Tr32. The gate terminal of the fourth N-channel MOS transistor Tr33 is connected to one end of a phase compensating capacitor C30. The other end of the phase compensating capacitor C30 is connected to the drain terminal of the fourth P-channel MOS transistor Tr32.

The output terminal $T_O$ of the operational amplifier 1 is commonly connected to the drain terminals of the fourth P-channel MOS transistor Tr32 and the fourth N-channel MOS transistor Tr33.

The constant current circuit 10 comprises the current-adjusting P-channel MOS transistor Tr10 having a gate terminal connected to the gate terminal of the current-supplying P-channel MOS transistor Tr20 of the differential amplifying circuit 20. The current-adjusting P-channel MOS transistor Tr10 and the current-supplying P-channel MOS transistor Tr20 cooperatively constitute a current mirror circuit. The current-adjusting P-channel MOS transistor Tr10 has a source terminal connected to the power line $L_V$ and a drain terminal connected to its gate terminal. The drain terminal of the current-adjusting P-channel MOS transistor Tr10 is connected via a resistor R10 to a drain terminal of a current-adjusting N-channel MOS transistor Tr11. The current-adjusting N-channel MOS transistor Tr11 has a source terminal connected to the ground line $L_G$ and a gate terminal connected to its drain terminal.

Furthermore, the operational amplifier 1 comprises a diode D1 interposed between the power line $L_V$ and the ground line $L_G$. An anode of the diode D1 is connected to the ground line $L_G$ and a cathode of the diode D1 is connected to the power line $L_V$. Providing the diode D1 is effective to prevent each transistor of the operational amplifier 1 from being damaged in an event that the power source is reversely connected to the operational amplifier 1. More specifically, even when the low-voltage terminal $T_{VL}$ is connected to the power-voltage terminal Vcc and the high-voltage terminal $T_{VH}$ is connected to the ground terminal (GND), a potential difference between the ground line $L_G$ and the power line $L_V$ is suppressed to a forward voltage (approximately 0.7V) of the diode D1.

According to the above-described constant current circuit 10, a voltage drop, corresponding to a threshold voltage $V_{THP}$ of the current-adjusting P-channel MOS transistor Tr10, is caused between the drain and source terminals of the current-adjusting P-channel MOS transistor Tr10. Furthermore, another voltage drop, corresponding to a threshold voltage $V_{THN}$ of the current-adjusting N-channel MOS transistor Tr11, is caused between the drain and source terminals of the current-adjusting N-channel MOS transistor Tr11. Accordingly, the constant current "I" determined by the following equation flows across the current-adjusting MOS transistors Tr10 and Tr11.

$$I=(VCC-V_{THP}-V_{THN})/R10 \qquad (1)$$

When the constant current "I" flows across the current-adjusting P-channel MOS transistor Tr10, the same current "I" flows across the current-supplying P-channel MOS transistor Tr20 as the current-adjusting P-channel MOS transistor Tr10 and the current-supplying P-channel MOS transistor Tr20 cooperatively constitute the current mirror circuit. In response to the constant current "I", the differential amplifying circuit 20 starts its operation. In response to the operation of the differential amplifying circuit 20, the output circuit 30 produces an output voltage responsive to an electrical potential difference between the inverting input terminal $T_{IM}$ and the non-inverting input terminal $T_{IP}$.

More specifically, when the voltage applied to the inverting input terminal $T_{IM}$ becomes smaller than the voltage applied to the non-inverting input terminal $T_{IP}$, the current flowing across the second PNP transistor Tr24 and the second P-channel MOS transistor Tr22 becomes smaller than the current flowing across the first PNP transistor Tr23 and the first P-channel MOS transistor Tr21. Accordingly, a drain terminal potential of the first N-channel MOS transistor Tr25 becomes higher than a drain terminal potential of the second N-channel MOS transistor Tr26. This makes an ON-resistance of the fourth N-channel MOS transistor Tr33 larger than an ON-resistance of the fourth P-channel MOS transistor Tr32. As a result, an increased output voltage is produced from the output terminal $T_O$.

On the contrary, when the voltage applied to the inverting input terminal $T_{IM}$ becomes larger the voltage applied to the non-inverting input terminal $T_{IP}$, the current flowing across the second PNP transistor Tr24 and the second P-channel MOS transistor Tr22 becomes larger than the current flowing across the first PNP transistor Tr23 and the first P-channel MOS transistor Tr21. Accordingly, the drain terminal potential of the first N-channel MOS transistor Tr25 becomes lower than the drain terminal potential of the second N-channel MOS transistor Tr26. This makes the ON-resistance of the fourth N-channel MOS transistor Tr33 smaller than the ON-resistance of the fourth P-channel MOS transistor Tr32. As a result, the output voltage of the output terminal $T_O$ is reduced.

According to the above-described circuit arrangement of the operational amplifier 1, the first embodiment uses the PNP transistors (i.e., PNP-type bipolar transistors) Tr23 and Tr24 as a pair of input transistors of the differential amplifying circuit 20. One PNP transistor Tr23 has the gate terminal connected to the inverting input terminal $T_{IM}$ via the resistor R21. The other PNP transistor Tr24 has the gate terminal connected to the non-inverting input terminal $T_{IP}$ via the resistor R22. The rest of the transistors provided in the operational amplifier 1 are MOS transistors.

Accordingly, the first embodiment provides an operational amplifier having a high through rate and providing an excellent withstanding voltage.

In general, a withstanding voltage between gate and source terminals of the MOS transistor is in a level of 10~20 V. On the other hand, a withstanding voltage between base and emitter terminals of a comparable bipolar transistor is approximately 40 V.

Accordingly, the operational amplifier 1 of the first embodiment is characterized by the bipolar transistors used exclusively for the input transistors of the differential amplifying circuit 20 and the MOS transistors used for the rest of the transistors.

The above-described operational amplifier 1 of the first embodiment is robust against a positive surge voltage higher than the power voltage Vcc. If such a high surge voltage is applied to either the inverting input terminal $T_{IM}$ or the non-inverting input terminal $T_{IP}$, the PNP transistor Tr23 or Tr24 will be reversely biased. However, the PNP transistor Tr23 or Tr24 can withstand against a significant higher voltage (approximately 40 V) equivalent to its base-emitter withstanding voltage $V_{EB}$.

The above-described high withstand characteristics cannot be obtained when the PNP transistors Tr23 and Tr24 are replaced by P-channel MOS transistors, or when the inverting input terminal $T_{IM}$ and the non-inverting input terminals $T_{IP}$ are directly connected to the gate terminals of the corresponding P-channel MOS transistors Tr21 and Tr22 without providing the PNP transistors Tr23 and Tr24 and the constant-current sources S21 and S22. In this case, if a positive surge voltage exceeding 10~20 V is applied to either the inverting input terminal $T_{IM}$ or the non-inverting input terminal $T_{IP}$, the operational amplifier 1 will be damaged or its performance will be deteriorated.

The inventors of the present invention conducted a computer-based circuit simulation on the operational amplifier 1 of the present invention. To evaluate the performance of the operational amplifier 1, a pulse signal rising from 0V to 5V is entered into the non-inverting input terminal $T_{IP}$ under a condition where the inverting terminal $T_{IM}$ is connected to the output terminal $T_O$. As a result of the performed simulation, an obtained through rate was 7V/µs.

On the other hand, when the PNP transistors Tr23 and Tr24 are replaced by P-channel MOS transistors, i.e., when all of the transistors of the operational amplifier 1 are constituted by MOS transistors, an obtained through rate was 7.75 V/µs under the same simulating conditions. On the other hand, when all of the transistors of the operational amplifier 1 are constituted by bipolar transistors, an obtained through rate was 2.5 V/µs under the same simulating conditions.

As apparent from the foregoing description, the operational amplifier 1 of the first embodiment can realize a high through rate comparable with an operational amplifier constituted by using only MOS transistors. Furthermore, the operational amplifier 1 of the first embodiment can provide a higher withstanding voltage without relying on additional special protecting elements, such as diodes and Zener diodes.

Moreover, if required, it is possible to remove the resistors R21 and R22 to directly connect the inverting input terminal $T_{IM}$ and the non-inverting input terminal $T_{IP}$ to the base terminals of the corresponding PNP transistors Tr23 and Tr24, respectively.

Second Embodiment

Figure 2:
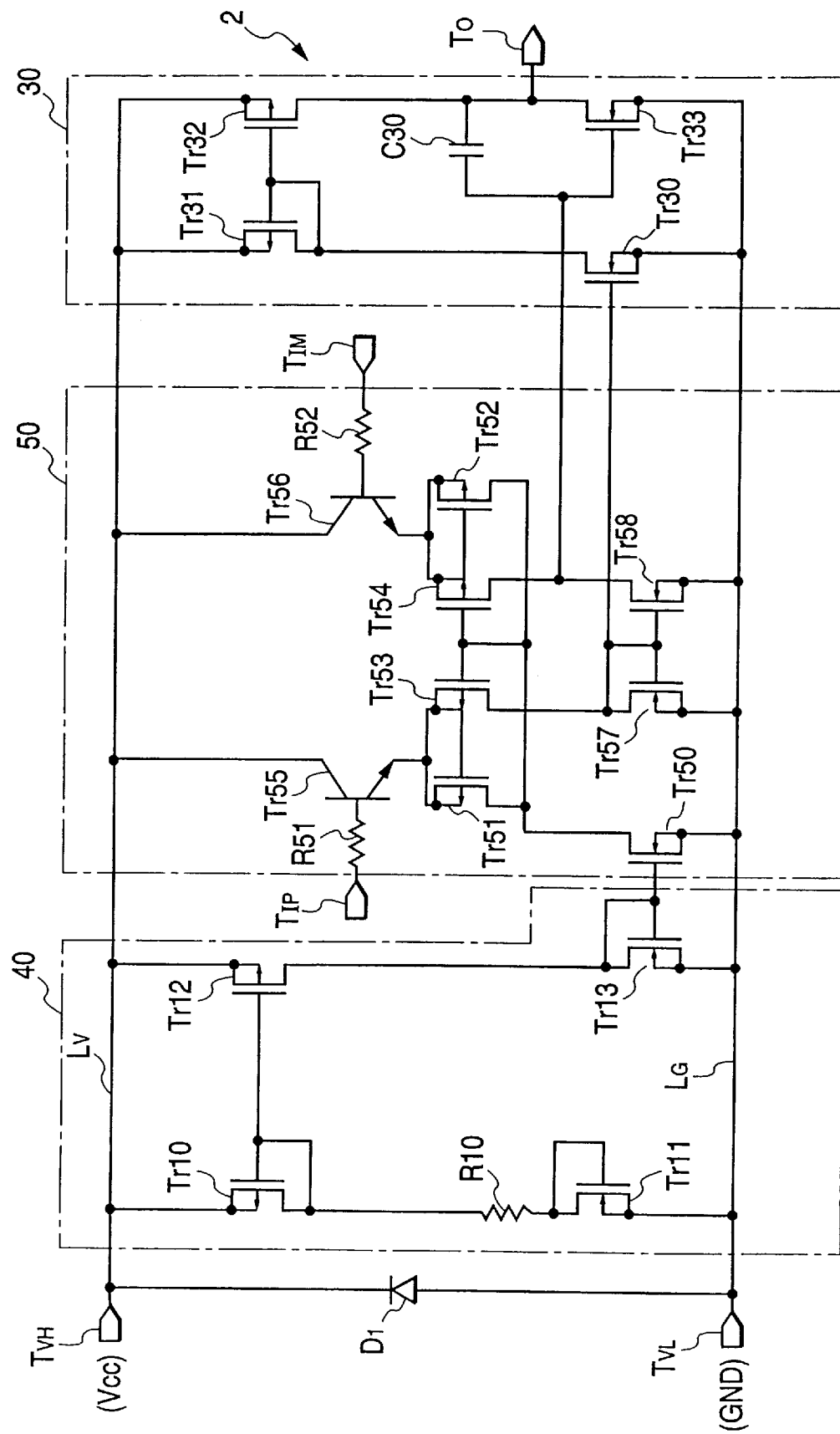
FIG. 2 is a circuit diagram showing an operational amplifier in accordance with a second embodiment of the present invention.

FIG. 2 is a circuit diagram showing an arrangement of an operational amplifier 2 in accordance with a second embodiment of the present invention. As shown in FIG. 2, the operational amplifier 2 of the second embodiment differs from the operational amplifier 1 of the first embodiment in that both the constant current circuit 10 and the differential amplifying circuit 20 are replaced by a constant current circuit 40 and a differential amplifying circuit 50, respectively. The output circuit 30 and the diode D1 are identical with those disclosed in the first embodiment.

The differential amplifying circuit 50 comprises a fifth N-channel MOS transistor Tr50 having a source terminal connected to the ground line $L_G$ and a gate terminal connected to a gate terminal of a sixth N-channel MOS transistor Tr13 of the constant current circuit 40. The sixth N-channel MOS transistor Tr13 operates to produce constant current in the constant current circuit 40. The same current as the constant current flowing in the constant current circuit 40 flows into a drain terminal of the fifth N-channel MOS transistor Tr50. Fifth and sixth P-channel MOS transistors Tr51 and Tr52 have drain and gate terminals commonly connected to the drain terminals of the fifth N-channel MOS transistor Tr50.

A seventh P-channel MOS transistor Tr53 have source and gate terminals connected to the source and gate terminals of the fifth P-channel MOS transistors Tr51. The fifth P-channel MOS transistors Tr51 and the seventh P-channel MOS transistors Tr53 cooperatively constitute a current mirror circuit. An eighth P-channel MOS transistor Tr54 have source and gate terminals connected to the source and gate terminals of the sixth P-channel MOS transistors Tr52. The sixth P-channel MOS transistors Tr52 and the eighth P-channel MOS transistors Tr54 cooperatively constitute a current mirror circuit.

A first NPN transistor Tr55, serving as one input transistor, has a collector terminal connected to the power line $L_V$, an emitter terminal connected to the sources of the P-channel MOS transistors Tr51 and Tr53, and a base terminal connected to the non-inverting input terminal $T_{IP}$ via a resistor R51. A second NPN transistor Tr56, serving as another input transistor, has a collector terminal connected to the power line $L_V$, an emitter terminal connected to the sources of the P-channel MOS transistors Tr52 and Tr54, and a base terminal connected to the inverting input terminal $T_{IM}$ via a resistor R52.

A seventh N-channel MOS transistor Tr57 having a drain terminal connected to the drain terminal of the seventh P-channel MOS transistor Tr53 and a base terminal commonly connected with its drain terminal, and a source terminal connected to the ground line $L_G$. An eighth N-channel MOS transistor Tr58 has a drain terminal connected to the drain terminal of the eighth P-channel MOS transistor Tr54 and a source terminal connected to the ground line $L_G$. A base terminal of the eighth N-channel MOS transistor Tr58 is connected to the date terminal of the seventh N-channel MOS transistor Tr57 so as to cooperatively constitute a current mirror circuit.

The drain terminal of the seventh N-channel MOS transistor Tr57 is connected to the gate terminal the third N-channel MOS transistor Tr30 of the output circuit 30. The drain terminal of the eighth N-channel MOS transistor Tr58 is connected to the gate terminal the fourth N-channel MOS transistor Tr33 of the output circuit 30.

The constant current circuit 40 comprises the sixth N-channel MOS transistor Tr13 and a ninth P-channel MOS transistor Tr12 in addition to the current-adjusting P-channel MOS transistor Tr10, the current-adjusting N-channel MOS transistor Tr11 and the resistor R10 disclosed in the above-described first embodiment. The ninth P-channel MOS transistor Tr12 has a source terminal connected to the power line $L_V$ and a gate terminal connected to the gate terminal of the current-adjusting P-channel MOS transistor Tr10. The ninth P-channel MOS transistor Tr12 and the current-adjusting P-channel MOS transistor Tr10 cooperatively constitute a current mirror circuit. The sixth N-channel MOS transistor Tr13 has drain and gate terminals commonly connected to a drain terminal of the ninth P-channel MOS transistor Tr12, and a source terminal connected to the ground line $L_G$. As described above, the gate terminal of the sixth N-channel MOS transistor Tr13 is connected to the gate terminal of the fifth N-channel MOS transistor Tr50 of the differential amplifying circuit 50.

According to the above-described constant current circuit 40, the constant current "I" determined by the above-described equation (1) flows across the current-adjusting MOS transistors Tr10 and Tr11, in the same manner as the first embodiment.

When the constant current "I" flows across the current-adjusting P-channel MOS transistor Tr10, the same current "I" flows across the ninth P-channel MOS transistor Tr12 via the sixth N-channel MOS transistor Tr13 as the current-adjusting P-channel MOS transistor Tr10 and the ninth P-channel MOS transistor Tr12 cooperatively constitute the current mirror circuit.

When the constant current "I" flows across the sixth N-channel MOS transistor Tr13 of the constant current circuit 40, the same current "I" flows across the fifth N-channel MOS transistor Tr50 of the differential amplifying circuit 50 as the sixth N-channel MOS transistor Tr13 and the fifth N-channel MOS transistor Tr50 cooperatively constitute the current mirror circuit. In response to this constant current "I", the differential amplifying circuit 50 starts its operation. In response to the operation of the differential amplifying circuit 50, the output circuit 30 produces an output voltage responsive to an electrical potential difference between the inverting input terminal $T_{IM}$ and the non-inverting input terminal $T_{IP}$.

More specifically, when the voltage applied to the inverting input terminal $T_{IM}$ becomes smaller than the voltage applied to the non-inverting input terminal $T_{IP}$, the current flowing across the first NPN transistor Tr55 and the P-channel MOS transistors Tr51 and Tr53 becomes larger than the current flowing across the second NPN transistor Tr56 and the P-channel MOS transistors Tr52 and Tr54. Accordingly, a drain terminal potential of the seventh N-channel MOS transistor Tr57 becomes higher than a drain terminal potential of the eighth N-channel MOS transistor Tr58. This makes the ON-resistance of the fourth N-channel MOS transistor Tr33 larger than the ON-resistance of the fourth P-channel MOS transistor Tr32. As a result, an increased output voltage is produced from the output terminal $T_O$.

On the contrary, when the voltage applied to the inverting input terminal $T_{IM}$ becomes larger the voltage applied to the non-inverting input terminal $T_{IP}$, the current flowing across the first NPN transistor Tr55 and the P-channel MOS transistors Tr51 and Tr53 becomes smaller than the current flowing across the second NPN transistor Tr56 and the P-channel MOS transistors Tr52 and Tr54. Accordingly, the drain terminal potential of the seventh N-channel MOS transistor Tr57 becomes lower than the drain terminal potential of the eighth N-channel MOS transistor Tr58. This makes the ON-resistance of the fourth N-channel MOS transistor Tr33 smaller than the ON-resistance of the fourth P-channel MOS transistor Tr32. As a result, the output voltage of the output terminal $T_O$ is reduced.

According to the above-described circuit arrangement of the operational amplifier 2, the second embodiment uses the NPN transistors (i.e., NPN-type bipolar transistors) Tr55 and Tr55 as a pair of input transistors of the differential amplifying circuit 50. One NPN transistor Tr55 has the gate terminal connected to the non-inverting input terminal $T_{IP}$ via the resistor R51. The other NPN transistor Tr56 has the gate terminal connected to the inverting input terminal $T_{IM}$ via the resistor R52. The rest of the transistors provided in the operational amplifier 2 are MOS transistors.

As apparent from the foregoing description, the operational amplifier 2 of the second embodiment can realize a high through rate comparable with an operational amplifier constituted by using only MOS transistors. Furthermore, the operational amplifier 2 of the second embodiment can provide a higher withstanding voltage without relying on additional special protecting elements, such as diodes and Zener diodes.

Moreover, it is possible to remove the resistors R51 and R52 to directly connect the non-inverting input terminal $T_{IP}$ and the inverting input terminal $T_{IM}$ to the base terminals of the corresponding NPN transistors Tr55 and Tr56, respectively.

Third Embodiment

Figure 3:
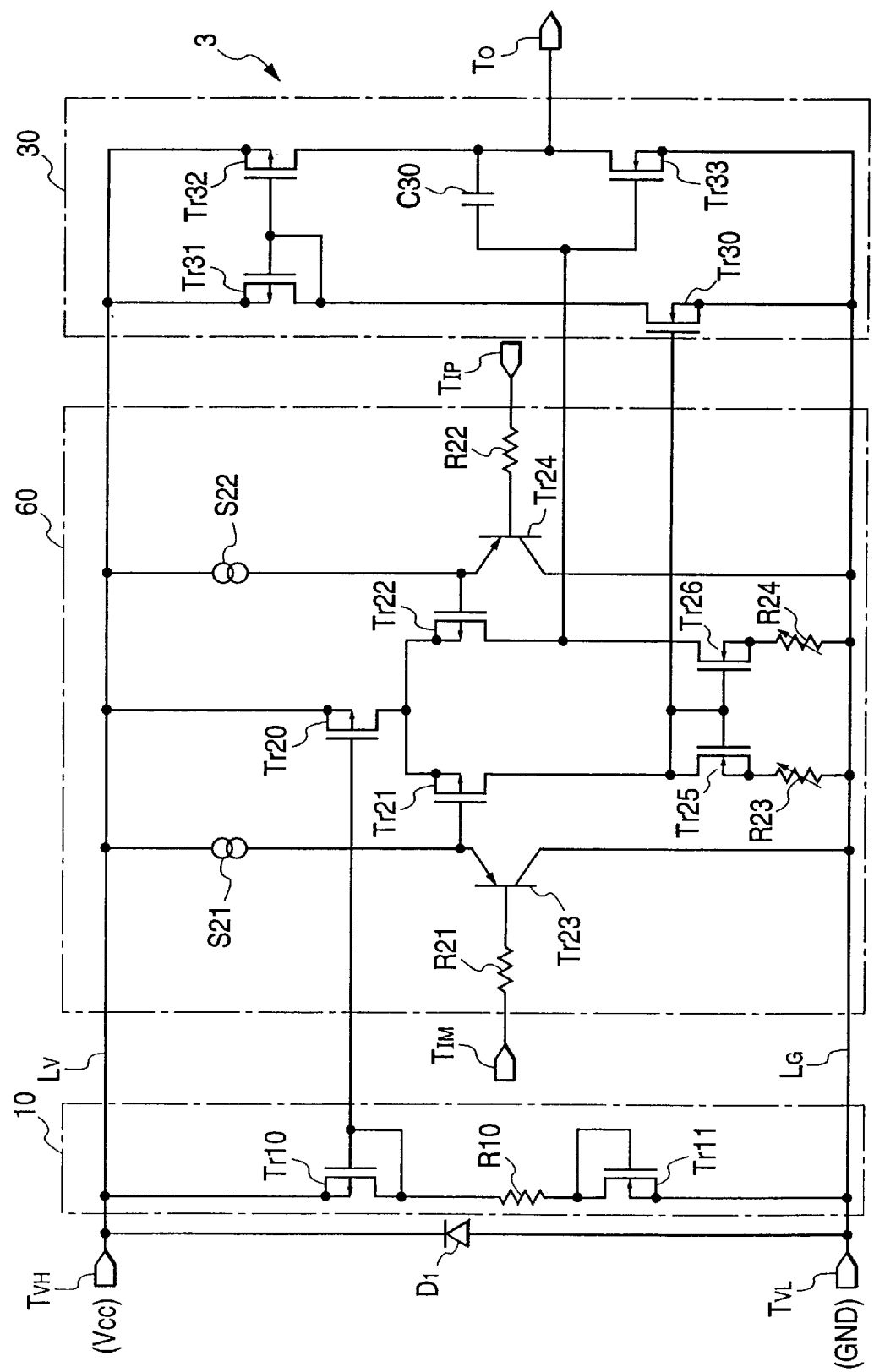
FIG. 3 is a circuit diagram showing an operational amplifier in accordance with a third embodiment of the present invention.

FIG. 3 is a circuit diagram showing an arrangement of an operational amplifier 3 in accordance with a third embodiment of the present invention. As shown in FIG. 3, the operational amplifier 3 of the third embodiment differs from the operational amplifier 1 of the first embodiment in that the differential amplifying circuit 20 is replaced by a differential amplifying circuit 60. The constant current circuit 10, the output circuit 30 and the diode D1 are identical with those disclosed in the first embodiment.

The differential amplifying circuit 60 comprises a pair of trimming resistors R23 and R24 in addition to the circuit elements of the differential amplifying circuit 20 disclosed in FIG. 1. One trimming resistor R23 is serially connected between the source terminal of the first N-channel MOS transistor Tr25 and the ground line $L_G$. The other trimming resistor R24 is serially connected between the source terminal of the second N-channel MOS transistor Tr26 and the ground line $L_G$. Each resistance value of these trimming resistors R23 and R24 is adjustable to optimize the operational balance of the differential amplifying circuit 60. The rest of the circuit arrangement of the differential amplifying circuit 60 is identical with that of the differential amplifying circuit 10 of the first embodiment.

According to the circuit arrangement of the operational amplifier 3, substantially the same effects as those of the operational amplifier 1 of the first embodiment can be obtained. Furthermore, an offset voltage of the operational amplifier 3 can be easily corrected by adjusting the resistance values of the trimming resistors R23 and R24 by laser trimming.

Fourth Embodiment

Figure 4:
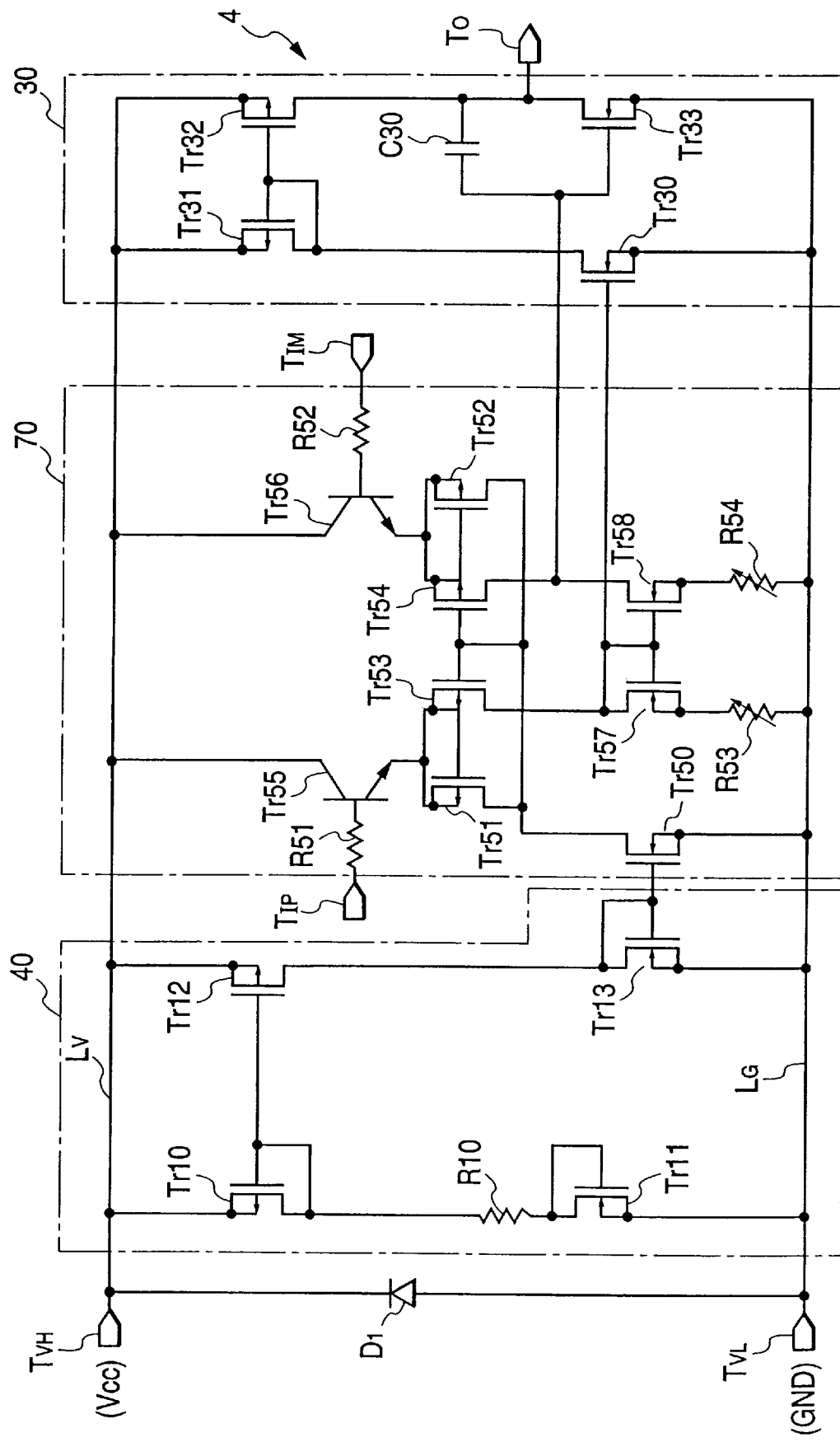
FIG. 4 is a circuit diagram showing an operational amplifier in accordance with a fourth embodiment of the present invention.

FIG. 4 is a circuit diagram showing an arrangement of an operational amplifier 4 in accordance with a fourth embodiment of the present invention. As shown in FIG. 4, the operational amplifier 4 of the fourth embodiment differs from the operational amplifier 2 of the second embodiment in that the differential amplifying circuit 50 is replaced by a differential amplifying circuit 70. The constant current circuit 40, the output circuit 30 and the diode D1 are identical with those disclosed in the second embodiment.

The differential amplifying circuit 70 comprises a pair of trimming resistors R53 and R54 in addition to the circuit elements of the differential amplifying circuit 50 disclosed in FIG. 2. One trimming resistor R53 is serially connected between the source terminal of the seventh N-channel MOS transistor Tr57 and the ground line $L_G$. The other trimming resistor R54 is serially connected between the source terminal of the eighth N-channel MOS transistor Tr58 and the ground line $L_G$. Each resistance value of these trimming resistors R53 and R54 is adjustable to optimize the operational balance of the differential amplifying circuit 70. The rest of the circuit arrangement of the differential amplifying circuit 70 is identical with that of the differential amplifying circuit 20 of the second embodiment.

According to the circuit arrangement of the operational amplifier 4, substantially the same effects as those of the operational amplifier 2 of the second embodiment can be obtained. Furthermore, an offset voltage of the operational amplifier 4 can be easily corrected by adjusting the resistance values of the trimming resistors R53 and R54 by laser trimming.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An operational amplifier comprising:

an inverting input terminal;

a non-inverting input terminal;

an output terminal;

a differential amplifying circuit comprising a pair of input transistors having control terminals connected to said inverting input terminal and said non-inverting input terminal, respectively;

an output circuit connected to said differential amplifying circuit for amplifying an output signal of said differential amplifying circuit and for providing an amplified output to said output terminal;

wherein said input transistors are bipolar transistors having base terminals serving as said control terminals; and other transistors provided in said operational amplifier, the other transistors being MOS transistors;

wherein said differential amplifying circuit comprises first and second MOS transistors cooperatively forming a current mirror circuit, said first MOS transistor produces a first terminal potential responsive to a voltage applied to said inverting input terminal and said second MOS transistor produces a second terminal potential responsive to a voltage applied to said non-inverting input terminal;

wherein said output is responsive to a difference between said first terminal potential and said second terminal potential; and wherein said first and second MOS transistors are N-channel MOS transistors that are associated with P-channel MOS transistors having gate terminals connected to output terminals of said input transistors.

2. The operational amplifier comprising:

an inverting input terminal;

a non-inverting input terminal;

an output terminal;

a differential amplifying circuit comprising a pair of input transistors having control terminals connected to said inverting input terminal and said non-inverting input terminal, respectively;

an output circuit connected to said differential amplifying circuit for amplifying an output signal of said differential amplifying circuit and for providing an amplified output to said output terminal, wherein wherein said input transistors are bipolar transistors having base terminals serving as said control terminals; and other transistors provided in said operational amplifier, the other transistors being MOS transistors, wherein said differential amplifying circuit comprises first and second MOS transistors cooperatively forming a current mirror circuit, said first MOS transistor produces a first terminal potential responsive to a voltage applied to said inverting input terminal and said second MOS transistor produces a second terminal potential responsive to a voltage applied to said non-inverting input terminal;

wherein said output is responsive to a difference between said first terminal potential and said second terminal potential; and wherein at least one of said first and second MOS transistors is serially connected with an adjustable trimming resistor adapted to optimize an operational balance of said differential amplifying circuit.

3. An operational amplifier comprising:

a differential amplifying circuit including (i) a differential pair of MOS transistors and (ii) a current-supplying MOS transistor supplying constant current to said differential pair of MOS transistors;

wherein said differential pair of MOS transistors have source and drain terminals respectively connected to current mirror circuits, the current mirror circuits including MOS transistors;

an output circuit connected to said differential amplifying circuit for amplifying an output signal of said differential amplifying circuit and for providing an amplified output to an output terminal; and a pair of bipolar transistors respectively connected to control gate terminals of said differential pair of MOS transistors;

wherein said differential amplifying circuit is activated by controlling said differential pair of MOS transistors via said pair of bipolar transistors in response to an input signal provided to said differential amplifying circuit.

4. The operational amplifier in accordance with claim 3, wherein said output circuit includes MOS transistors.

5. An operational amplifier comprising:

a differential amplifying circuit including (i) a differential pair of MOS transistors and (ii) a current-supplying MOS transistor supplying constant current to said differential pair of MOS transistors;

an output circuit connected to said differential amplifying circuit for amplifying an output signal of said differential amplifying circuit and for providing an amplified output to an output terminal; and a pair of bipolar transistors respectively connected to control gate terminals of said differential pair of MOS transistors;

wherein said differential amplifying circuit comprises first and second MOS transistors cooperatively constituting a current mirror circuit, said first MOS transistor being adapted to produce a first terminal potential responsive to a voltage applied to one of said pair of bipolar transistors and said second MOS transistor being adapted to produce a second terminal potential responsive to a voltage applied to the other of said pair of bipolar transistors;

wherein the output is responsive to a difference between said first terminal potential and said second terminal potential; and wherein said differential amplifying circuit is activated by controlling said differential pair of MOS transistors via said pair of bipolar transistors in response to an input signal provided to said differential amplifying circuit.

6. The operational amplifier in accordance with claim 5, wherein said first and second MOS transistors are N-channel MOS transistors that are associated with P-channel MOS transistors having gate terminals connected to output terminals of said bipolar transistors.

7. The operational amplifier in accordance with claim 5, wherein said first and second MOS transistors are N-channel MOS transistors that are associated with current mirror circuits connected to output terminals of said bipolar transistors.

8. The operational amplifier in accordance with claim 5, wherein at least one of said first and second MOS transistors is serially connected with a trimming resistor that is adjustable to optimize an operational balance of said differential amplifying circuit.

9. An operational amplifier comprising:

a differential amplifying circuit including (i) a differential pair of MOS transistors and (ii) a current-supplying MOS transistor supplying constant current to said differential pair of MOS transistors;

wherein said differential pair of MOS transistors have source and drain terminals respectively connected to current mirror circuits, the current mirror circuits including MOS transistors;

an output circuit connected to said differential amplifying circuit for amplifying an output signal of said differential amplifying circuit and for providing an amplified output to an output terminal; and a pair of bipolar transistors respectively connected to control gate terminals of said differential pair of MOS transistors;

wherein one of said pair of bipolar transistors has a base terminal serving as an inverting input terminal of said differential amplifying circuit, and the other of said pair of bipolar transistors has a base terminal serving as a non-inverting input terminal of said differential amplifying circuit.

10. The operational amplifier in accordance with claim 9, wherein said output circuit includes MOS transistors.

11. An operational amplifier comprising:

a differential amplifying circuit including (i) a differential pair of MOS transistors and (ii) a current-supplying MOS transistor supplying constant current to said differential pair of MOS transistors;

an output circuit connected to said differential amplifying circuit for amplifying an output signal of said differential amplifying circuit and for providing an amplified output to an output terminal;

wherein said differential amplifying circuit comprises first and second MOS transistors cooperatively forming a current mirror circuit, said first MOS transistor being adapted to produce a first terminal potential responsive to a voltage applied to said inverting input terminal and said second MOS transistor being adapted to produce a second terminal potential responsive to a voltage applied to said non-inverting input terminal;

wherein said output is responsive to a difference between said first terminal potential and said second terminal potential; and a pair of bipolar transistors respectively connected to control gate terminals of said differential pair of MOS transistors;

wherein one of said pair of bipolar transistors has a base terminal serving as an inverting input terminal of said differential amplifying circuit, and the other of said pair of bipolar transistors has a base terminal serving as a non-inverting input terminal of said differential amplifying circuit.

12. The operational amplifier in accordance with claim 11, wherein said first and second MOS transistors are N-channel MOS transistors and are associated with P-channel MOS transistors having gate terminals connected to output terminals of said bipolar transistors.

13. The operational amplifier in accordance with claim 11, wherein said first and second MOS transistors are N-channel MOS transistors and are associated with current mirror circuits connected to output terminals of said bipolar transistors.

14. The operational amplifier in accordance with claim 11, wherein at least one of said first and second MOS transistors is serially connected with a trimming resistor that is adjustable to optimize an operational balance of said differential amplifying circuit.

* * * * *